United States Patent
Wald et al.

[11] Patent Number: 5,932,491
[45] Date of Patent: Aug. 3, 1999

[54] REDUCTION OF CONTACT SIZE UTILIZING FORMATION OF SPACER MATERIAL OVER RESIST PATTERN

[75] Inventors: Phillip G. Wald; Mark Fischer, both of Boise; William A. Stanton, Boixe, all of Id.

[73] Assignee: Micron Technology, Inc., Boise, Id.

[21] Appl. No.: 08/796,399

[22] Filed: Feb. 6, 1997

[51] Int. Cl.$^6$ .................................................. H01L 21/00
[52] U.S. Cl. ........................ 438/734; 438/692; 257/752; 257/775
[58] Field of Search ................... 438/692, 723, 438/733, 734, 744, 743, 626, 631, 637, 639, 666, 672, 696; 216/38; 257/734, 752, 773, 775

[56] References Cited

U.S. PATENT DOCUMENTS

| | | | |
|---|---|---|---|
| 5,180,689 | 1/1993 | Liu et al. ............................. | 438/723 X |
| 5,270,241 | 12/1993 | Dennison et al. ....................... | 437/52 |
| 5,719,089 | 2/1998 | Cherng et al. ....................... | 438/723 X |
| 5,783,496 | 7/1998 | Flanner et al. ....................... | 438/723 X |

OTHER PUBLICATIONS

H. Sakai et al., "A Trench Isolation Technology For High–Speed And Low–Power Dissipation Bipolar LSI's," Semiconductor Research Center, Japan, pp. 17–18.

S. Kimura et al., "A New Stacked Capacitor DRAM Cell Characterized By A Storage Capacitor On A Bit–Line Structure," Central Research Laboratory, Japan, 1988, IEEE, pp. 596–599.

*Primary Examiner*—William Powell
*Attorney, Agent, or Firm*—Fletcher, Yoder & Van Someren

[57] ABSTRACT

A method for forming a sidewall aligned contact structure without a hardmask layer. A semiconductor region is provided having an active area at an upper surface. An insulating layer is formed having an upper surface over the active area. Using a photo-patterned organic mask, a gross contact opening is etched in the insulating layer over the active area. The gross contact opening extends downward from the upper surface and partially through the insulating layer. A conformal layer of material is deposited at low temperature over the patterned mask as well as sidewalls and a bottom surface of the gross contact opening The conformal layer comprises a material that is differentially etchable with respect to the photomask and preferably etches similarly to the insulating layer. A portion of the insulating layer at the base of the gross contact opening is exposed. A contact opining is formed in the exposed portion of the insulating layer using the remaining conformal layer as a mask.

18 Claims, 2 Drawing Sheets

REDUCTION OF CONTACT SIZE UTILIZING FORMATION OF SPACER MATERIAL OVER RESIST PATTERN

BACKGROUND OF THE INVENTION

1. Field of the Invention

The present invention relates, in general, to interconnect structures for integrated circuits, and, more particularly, to a contact structure manufactured with fewer mask steps for random access memory circuits.

2. State of the Art

Integrated circuits are mass produced by fabricating hundreds of identical circuit patterns on a single semiconductor substrate. The fabricated wafer is sawed into hundreds of identical dies or chips. While integrated circuits are commonly referred to as "semiconductor devices" they are in fact fabricated from various materials including conductors, insulators, and semiconductors. Silicon, the most commonly used semiconductor material, can be used in either the single crystal or polycrystalline form. In the integrated circuit fabrication art, polycrystalline silicon is usually called "polysilicon" or simply "poly".

MOS (Metal Oxide Semiconductor) technology is currently the most commonly used integrated circuit technology, and thus the present invention will be described in terms of silicon-based MOS technology, although it is evident that it will find uses in other integrated circuit technologies.

MOS integrated circuit fabrication uses a lightly-doped silicon substrate or lightly-doped epitaxial silicon (deposited crystalline silicon) on a heavily doped substrate. Devices are formed in and on the substrate using many available processing techniques. An area in an integrated circuit in which electrical devices are formed is generally called an active area. The active areas on a chip are covered with a protective insulating layer. Conductive structures called "contacts" extend through the protective insulating layer to electrically couple to the active areas.

The advantages of building integrated circuits with smaller individual circuit elements so that more and more circuitry may be packed on a single chip are well-known: electronic equipment becomes less bulky, reliability is improved, assembly and packaging costs are minimized, and improved circuit functionality and performance, in particular higher clock speeds. However, the smaller the size, the more difficult it is to fabricate and locate individual structures, such as contacts, within the specifications and tolerances required.

As more devices are formed on a single chip, the need for interconnections among the devices increases dramatically. Many circuits require multiple layers of patterned conductive "wiring" to provide these interconnections. Where one patterned conductive layer must couple to another patterned conductive layer or to devices in the substrate, a contact is used to physically and electrically access the lower conductive layer. Because of the large number of contacts it is desirable to minimize the size of each contact.

Recently, a memory cell design has been invented that uses sidewall spacer technology to form a small-dimension contacts to active areas through an insulating layer formed over the active areas. These contacts resemble a vertical column having a lower termination at the active area and a wider termination at the top to ease electrical contact to overlying metallization. This technology is described in U.S. patent application Ser. No. 08/622,591, entitled SEMICON- DUCTOR PROCESSING METHOD OF FORMING A CONTACT PEDESTAL, OF FORMING A STORAGE NODE OF A CAPACITOR, AND INTEGRATED CIRCUITRY, assigned to the assignee of the present invention. This technology uses a hardmask to protect the insulating layer during contact etch process. The hardmask deposition adds an extra step of processing. Also, the hardmask must be patterned, adding additional etch processing, and removed once the contact is formed. It is desirable to provide the advantages of the sidewall aligned contact without the use of a hardmask.

It is a significant advantage if an IC design can eliminate one or more processing steps. In particular, it is desirable to eliminate patterning steps that involve multiple steps and add significant cycle time and cost to an integrated circuit process.

SUMMARY OF THE INVENTION

Briefly stated, the present invention involves a method for forming a sidewall aligned contact structure without a hardmask layer. A semiconductor region is provided having an active area at an upper surface. An insulating layer is formed having an upper surface over the active area. Using a photo-patterned organic mask, a gross contact opening is etched in the insulating layer over the active area. The gross contact opening extends downward from the upper surface and partially through the insulating layer. A conformal layer of material is deposited at low temperature over the patterned mask as well as sidewalls and a bottom surface of the gross contact opening The conformal layer comprises a material that is differentially etchable with respect to the photomask and preferably etches similarly to the insulating layer.

A portion of the insulating layer at the base of the gross contact opening is exposed. A contact opining is formed in the exposed portion of the insulating layer using the remaining conformal layer as a mask. The contact opening is filled with a conductive material.

DETAILED DESCRIPTION OF THE PREFERRED EMBODIMENT

Overview

Figure 1:
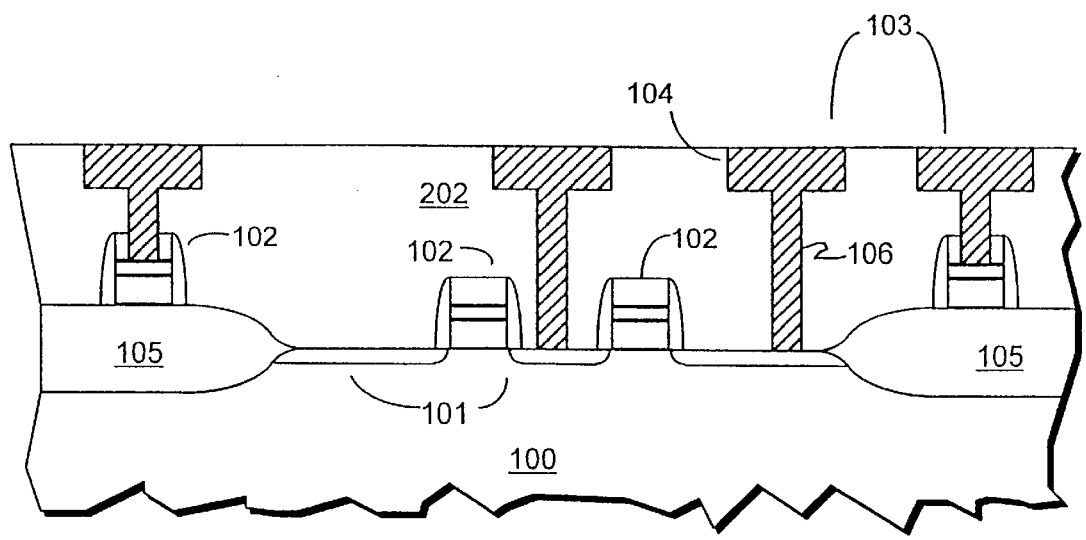
FIG. 1 shows a cross-section view of a portion of an integrated circuit chip having the contact structure in accordance with the present invention.

FIG. 1 shows a cross-section view of a portion of an integrated circuit chip having the contact structure in accordance with the present invention. The structure shown in FIG. 1 includes semiconductor structure having an upper surface 100. Formed on or within surface 100 are active device structures 101 and field insulators 105 comprising, for example, insulating oxide material. Example p-type and n-type dopant materials used to dope surface 100 include phosphorus or arsenic and boron or $BF_2$.

Gate electrodes 102 comprise one or more conductive layers electrically isolated from the surface of active area 101 by a thin gate oxide or gate insulating layer. The actual selection of materials used for gate electrode 102 is not critical, and any available technology may be used in accordance with the present invention. Typically, a device structure 101 on one side of gate electrode 102 serves as a source electrode while a device structure 101 on an opposite side serves as a drain electrode.

An interlayer dielectric 202, for example borophosphosilicate glass (BPSG) is formed covering gate structures 102 and upper surface 100 device structures 101 and field oxide 105. Contact structures 103, each including a pedestal portion 104 and a pillar portion 106, extend downward from the surface of dielectric layer 202 to make electrical contact to, for example, device structures 101. Preferably, contact structures 103 are formed having an upper surface that is flush or planar with the upper surface of interlayer dielectric 202 allowing easier connection to conductive structures formed above runner 103 (not shown).

Method for Forming Contact

A principle advantage of the present invention is the formation of a sidewall aligned contact (SAC) structure that uses fewer process steps than the prior art by elimination of a hardmask and processing associated with a hardmask. In the past, the hardmask was used to protect the interlayer dielectric during the etch used to expose the active area to which contact was to be made. So that only a single photo-patterning step was required, the photo pattern was transferred to the hardmask. The hardmask comprised a material that could withstand the high temperature processing associated with the sidewall formation process that defined the ultimate contact opening. Using a hardmask, the photo resist could be stripped before the conformal layer of material used to form the contact was applied. The high temperature processing used to form the conformal layer is incompatible with polymer photoresist technology.

Figure 2:
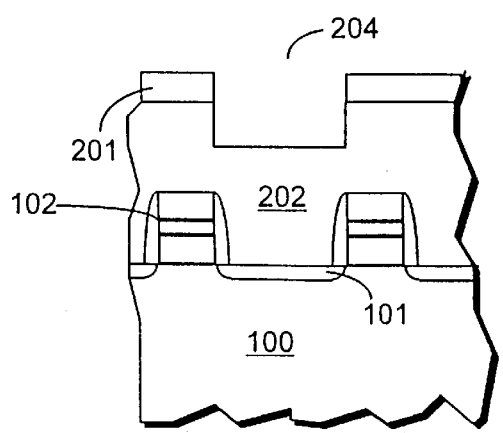
FIG. 2 show a cross-section of the structure shown in FIG. 1 at an early stage of processing.

As shown in FIG. 2, the process in accordance with the present invention begins with a partially processed structure formed on surface 100 having active areas 101 formed therein. Also shown is a multi-layer gate structure 102 formed on a thin gate oxide (not visible). Interlayer dielectric 202 is formed by chemical vapor deposition, sputtering, or other thin film formation technique that results in a substantially conformal coating having a planar upper surface. The upper surface of interlayer dielectric 202 may be planarized by polishing, etching, or the like if desired.

A conventional photoresist mask 201 is formed and pattered on the upper surface of interlayer dielectric 202. Photoresist mask 201 desirably comprises a material with as much resistance to high temperature processing as available, but conventional photoresist technology provides suitable performance. Photoresist mask 201 has sufficient thickness to protect the upper surface of interlayer dielectric 202 through an etch extending substantially through the thickness of interlayer dielectric 202. Hence, resist mask 201 may be thicker or thinner than conventionally applied to accommodate this etch (described below). In one embodiment, resist mask 201 has a thickness such that it is substantially removed at the final stages of the etch through interlayer dielectric 202, although this feature is not required to practice the present invention.

Interlayer dielectric 202 is etched in at least two stages, the first of which is illustrated in FIG. 2. This first stage etch uses photoresist 201 as a mask and creates a cavity 204 extending only partially through the thickness of interlayer dielectric 202. The bottom surface of cavity 204 is at a height selected to be above the device features such as gate structure 102. In a particular example, the first stage etch is timed to leave approximately 0.5 micrometer of ILD 202 remaining over device feature 102. As shown in FIG. 1, some of gate structures 102 may be formed on top of field oxide 105. Desirably, the bottom surface of cavity 204 is above these features also.

Figure 3:
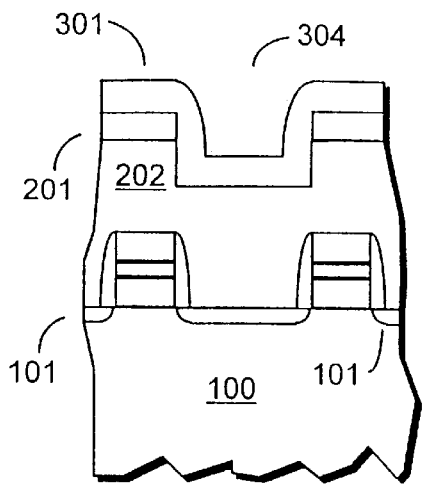
FIG. 3 show a cross-section of the structure shown in FIG. 2 at a later stage of processing.

As shown in FIG. 3, the upper surface of resist mask 201 and the surfaces of cavity 204 are filled with a low temperature film 301 to provide a partially filled cavity 304. Low temperature film 301 comprises any type of material that can be deposited conformably at sufficiently low temperature (i.e., less than about 200 C.) such that resist mask 201 remains substantially intact. Also, low temperature film should etch faster than resist mask 201 in some anisotropic etch chemistry.

Examples of suitable materials for low temperature film 301 include silicon oxide, polymers, polysilicon, tungsten, and titanium tungsten applied through chemical vapor deposition. Any low temperature deposition process is suitable including optically enhanced CVD and microwave or plasma enhanced CVD where low temperature layer 301 can be deposited as a substantially conformal thin film to partially fill cavity 304.

Figure 4:
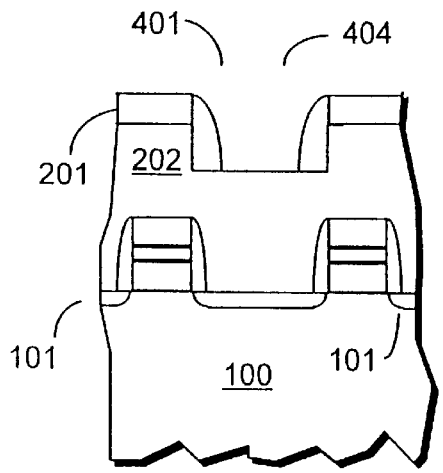
FIG. 4 show a cross-section of the structure shown in FIG. 3 at a later stage of processing.

The thickness of low temperature film 301 is selected to provide a desired width of sidewall spacers 401 shown in FIG. 4. Low temperature film 301 is patterned using, for example, spacer etch techniques to expose a portion of interlayer dielectric 202 at the base of spacer narrowed cavity 404. Cavity 404 defines the ultimate contact opening width. The spacer etch shown in FIG. 4 results in clearing substantially all of low temperature film 401 from the upper surface of resist mask 201. Also, sidewall spacers 401 extend along sidewalls of resist mask 201 and ILD 202.

Figure 5:
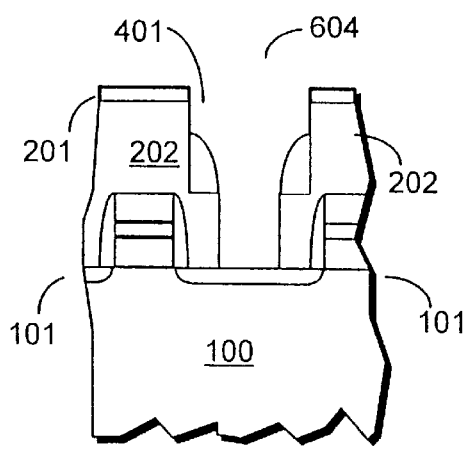
FIG. 5 show a cross-section of the structure shown in FIG. 4 at a later stage of processing.

FIG. 5 illustrates the structure of FIG. 4 after a second stage contact etch performed using photoresist mask 201 and spacers 401 as a mask. Upon completion of the structure shown in FIG. 4, the etch chemistry is altered to preferentially etch ILD 202 using photoresist 201 as a mask. Where ILD 202 and spacers 401 comprise similar material, no change in etch chemistry is required. This second stage etch extends substantially through the remaining thickness of interlayer dielectric 202 to expose active area to which contact is to be made (e.g., device structure 101 in FIG. 1). During the second stage etch, photoresist mask 201 is etched, although at a slower rate than the material of interlayer dielectric 202. This offers an advantage with respect to the prior methods in that photoresist mask 201 can be substantially or completely removed during the second stage etch thereby eliminating a separate mask removal process.

Figure 6:
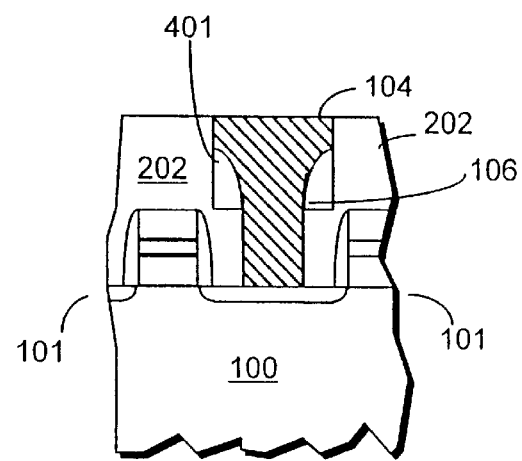
FIG. 6 show a cross-section of the structure shown in FIG. 5 at a late stage of processing.

Desirably, spacers 401 are etched also during the second stage and so appear to travel downward as illustrated in FIG. 5. By allowing spacers 401 to travel, etched spacers 401 are formed that do not extend onto resist mask 201. Because resist mask 201 will be removed, it is desirable that etched spacers 401 do not contact resist mask 201. Another advantage of traveling spacers 401 is that the spacer 401 can leave widened or "pedestal" portion 104 at the upper portion of the contact as shown in FIG. 6. Pedestal portion 104 enables simpler more reliable electrical connection to overlying interconnect and devices structures.

Thickness of photoresist 201 and conformal layer 301 (shown in FIG. 3) can be selected to tailor the profile of the upper portion of contact 106. When photoresist 201 is thicker, it will be completely removed during the second stage etch and some of the ILD 202 will be consumed. This results in a contact structure with a wider, more gently sloped upper surface (i.e., lower aspect ratio) to aid filling without keyholes.

When oxide is used for spacers 401, there will be little undercutting during the second stage contact etch. This also minimizes keyholes in the filled contact 106.

After the second stage etch is complete and contact opening 604 is formed, any remaining portion of resist mask 201 is desirably removed using plasma or wet cleaning techniques. However, spacers 401 remain intact. It is desirable that the second stage etch remove as much or all of resist mask 201 as device structure 101 is exposed. This is because resist mask 201 will likely be hardened substantially as compared to conventional photoresist masks due to the exposure to higher temperatures over time than conventional photoresist materials. The additional processing called for by the present invention results in more polymerization of the material in resist mask 201, hence, increasing difficulty in removing resist mask 201. By making mask 201 sufficiently thin that it is almost or completely eroded during the etch of interlayer dielectric 202, this cleaning step can be simplified or eliminated. If resist mask is selected to be removed during the second stage etch, it is desirable that interlayer dielectric 202 be made somewhat thicker to allow for ample etch time to expose the surface of device structure 101.

As shown in FIG. 6, contact opening 604 is filled with a conductive material such as polysilicon, tungsten, titanium tungsten, or the like. Preferably, pedestal portion 104 is planarized by lapping, etching, chemical-mechanical polishing, or the like.

The present invention provides a high density sidewall aligned contact to integrated devices without requiring hardmask deposition, patterning, and removal processes. Because the contact structure in accordance with the present invention can be formed without a hardmask, chips can be manufactured with fewer process steps while achieving the space benefits of vertically stacked interconnections. The preferred examples use polysilicon material in their construction which, because of its high resistivity, is usually suitable for short interconnections where power dissipation is not an issue. However, lower resistivity material can also be used such as TiW, TiN, W, or other equivalent low resistivity metallization without departing from the teachings of the present invention. It is to be expressly understood that the claimed invention is not to be limited to the description of the preferred embodiment but encompasses other modifications and alterations, including equivalent structures and methods expressly recited herein, within the scope and spirit of the inventive concept.

We claim:

1. A method for forming a contact comprising:
    providing a semiconductor surface having an active area thereon and an insulating layer having an upper surface formed on the active area;
    defining a contact window over the insulating layer and aligned over the active area with an organic mask;
    etching a first cavity through the contact window partially through the insulating layer;
    depositing a thin film over the mask while leaving the mask substantially intact;
    anistropically etching the thin film to form spacers on edges of the first cavity to expose a portion of the insulating layer at the base of the first cavity and at least a portion of the mask;
    etching the insulating layer exposed at the base of the first cavity using the exposed mask and spacers as a second mask to form a contact opening through which a portion of the active area under the first cavity is exposed; and
    filling the contact opening with a conductive material.

2. The method of claim 1 wherein depositing a conformal thin film comprises depositing an oxide at approximately 250° C.

3. The method of claim 2 wherein defining a contact window further comprises:
    applying a selected thickness of photoresist to the insulating layer, such that the photoresist is substantially removed from the insulating layer at substantially the same time that the contact opening is completed.

4. The method of claim 1 further comprising:
    applying a selected thickness of photoresist to insulating layer, such that the photoresist is substantially removed from the insulating layer before the active area is exposed, and etching the insulating layer at the base of the first cavity further comprises simultaneously etching the insulating layer at the top of the first cavity such that an upper portion of the cavity has a larger aspect ratio than a lower portion of the cavity.

5. A method for forming an contact opening to an active area comprising:
    covering the active area with a first layer;
    forming a photomask over the first layer;
    patterning the photomask to expose a first window at an upper surface of the first layer, the first window located over the active area;
    forming a first cavity in the first layer using the photomask as a mask, the first cavity extending only partially through the first layer;
    covering the photomask and partially filling the first cavity with a second layer;
    removing portions of the second layer to expose a second window at the upper surface of the first layer in the cavity and over the active area, the second window being smaller than the first window; and
    forming a second cavity in the first layer extending from the first cavity to the active area through the second window.

6. The method of claim 5 wherein the first layer comprises materials having similar etch characteristics during the step of forming a second cavity.

7. The method of claim 5 wherein the first and second layer comprise silicon oxide and the method further comprises the steps of:
    substantially removing the photomask during the process of forming a second cavity in the first layer.

8. A contact structure comprising:
    a semiconductor surface having an active area;
    a dielectric layer over the active area, the dielectric layer having a first cavity extending from an upper surface of the dielectric layer partially through the dielectric layer;
    a patterned photoresist layer on the upper surface of the dielectric layer and defining a gross contact window, the gross contact window being aligned with the first cavity; and
    spacers formed on sidewalls of the gross contact window to define a smaller final contact window.

9. The structure of claim 8 further comprising a second cavity aligned with the final contact opening and extending from a base of the first cavity entirely through the dielectric layer.

10. The structure of claim 8 wherein the spacers extend along sidewalls of the first cavity.

11. The structure of claim 9 further comprising contact material disposed within at least the second cavity in contact with the active area.

12. The structure of claim 9 wherein an upper portion of the first cavity is wider than a lower portion of the first cavity.

13. The structure of claim 9 wherein the spacer extends from a base of the first cavity upward along a sidewall of the first cavity to a position below the patterned photoresist.

14. A method for forming a contact opening in a layer of material comprising:

forming a first opening having a first width extending from an upper surface of the layer of material only partially through the layer of material;

forming a mask comprising a photo polymer covering the upper surface and non-polymer spacers covering sidewalls of the first opening; and forming using the mask a second opening having a second width narrower than the first width, the second opening extending downward from a bottom surface of the gross opening.

15. The method of claim 14 wherein the step of forming the mask comprises:

applying the photo polymer to the upper surface of the layer of material before forming the first opening;

forming a non-polymer layer in contact with and covering the photo polymer as well as sidewalls and bottom surface of the first opening after forming the first opening; and removing a portion of the non-polymer layer in contact with the photo polymer and bottom surface of the first opening.

16. The method of claim 15 wherein forming the non-polymer layer comprises reactive chemical vapor deposition at a temperature below 200 C.

17. The method of claim 14 wherein forming the second opening further comprises simultaneously removing at least a portion of the mask.

18. The method of claim 14 further comprising filling the first and second openings with a conductive material while at least a portion of the mask remains intact.

* * * * *